United States Patent [19]

Yabe

[11] Patent Number: 4,964,057
[45] Date of Patent: Oct. 16, 1990

[54] BLOCK PLACEMENT METHOD

[75] Inventor: Shoji Yabe, Tokyo, Japan

[73] Assignee: NEC Corporation, Tokyo, Japan

[21] Appl. No.: 386,002

[22] Filed: Jul. 27, 1989

Related U.S. Application Data

[63] Continuation of Ser. No. 117,995, Nov. 9, 1987, abandoned.

[30] Foreign Application Priority Data

Nov. 10, 1986 [JP] Japan ................................ 61-265479

[51] Int. Cl.$^5$ ............................................. G06F 15/60
[52] U.S. Cl. .................................. 364/491; 364/490; 364/489; 364/488
[58] Field of Search ................. 364/488, 489, 490, 491

[56] References Cited

U.S. PATENT DOCUMENTS

| | | | |
|---|---|---|---|
| 3,654,615 | 4/1972 | Freitag | 364/491 |
| 3,681,782 | 8/1972 | Scanlon | 364/491 |
| 4,593,363 | 6/1986 | Burstein et al. | 364/491 |
| 4,630,219 | 12/1986 | DiGiacomo et al. | 364/488 |
| 4,686,629 | 8/1987 | Noto et al. | 364/491 |
| 4,700,317 | 10/1987 | Watanabe et al. | 364/488 |
| 4,754,408 | 6/1988 | Carpenter et al. | 364/488 |

OTHER PUBLICATIONS

"A Routing Program Applicable to Various Chip Structures of Gate Arrays", Joho Shori Gakkai, Ronbunshi, vol. 25, No. 3, May 1984, pp. 357–364.

Mead et al, Introduction to VLSI Systems, pp. 38–45 (1980).

VLSI Design, vol. V, No. 4, pp. 35–43, Apr. 1984, Robson, Gary, "Automatic Placement and Routing of Gate Arrays".

Primary Examiner—Parshotam S. Lall
Assistant Examiner—V. N. Trans
Attorney, Agent, or Firm—Foley & Lardner, Schwartz, Jeffery, Schwaab, Mack, Blumenthal & Evans

[57] ABSTRACT

A block placement method and system for automatically placing a plurality of blocks on a substrate. A temporary groundwork design is established which does not contain a block placement inhibited area, such area being reserved from power lines. Initially, the blocks are placed upon the temporary groundwork design in a provisional groundwork design. An extended block is obtained upon inserting a block placement inhibited areas into the provisional groundwork design. Wiring is routed within the extended block on a placed substrate.

2 Claims, 4 Drawing Sheets

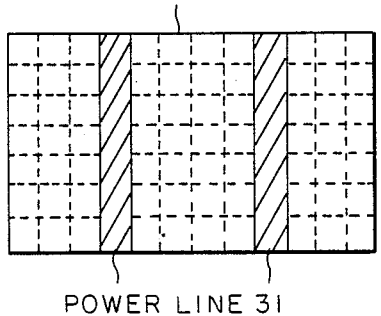
FIG. IA
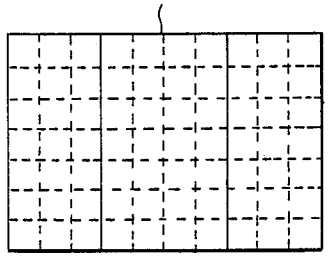
FIG. IB.
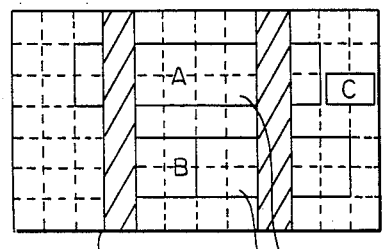
FIG. ID
FIG. IC
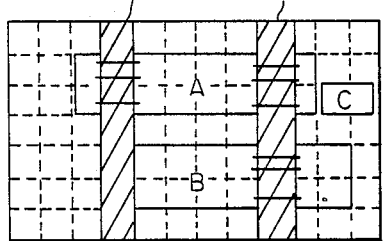
FIG. IE

FIG. 2A

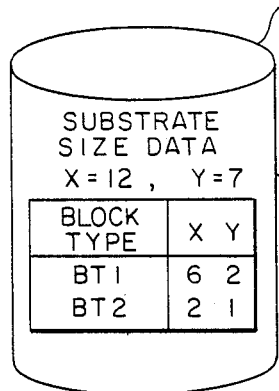

ORIGINAL SUBSTRATE CONSTRUCTION FILE 17

SUBSTRATE SIZE DATA
X=12, Y=7

| BLOCK TYPE | X | Y |
|---|---|---|
| BT1 | 6 | 2 |
| BT2 | 2 | 1 |

THE FIRST TABLE 18

| POWER LINE | CELL COLUMN |
|---|---|
| X | 4 |
| X | 9 |

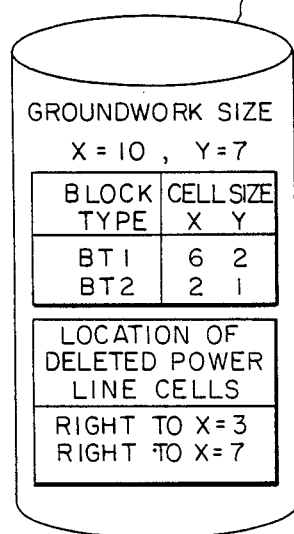

GROUNDWORK CONSTRUCTION FILE 19

GROUNDWORK SIZE
X=10, Y=7

| BLOCK TYPE | CELL SIZE X | Y |
|---|---|---|
| BT1 | 6 | 2 |
| BT2 | 2 | 1 |

LOCATION OF DELETED POWER LINE CELLS

| RIGHT TO X=3 |
| RIGHT TO X=7 |

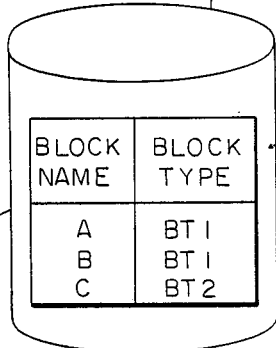

LOGICAL CONNECTION FILE 20

| BLOCK NAME | BLOCK TYPE |
|---|---|
| A | BT1 |
| B | BT1 |
| C | BT2 |

Flow: START → 1 SUBSTRATE CONSTRUCTION DATA INPUT → 2 IDENTIFICATION OF POWER LINE CELLS → 3 DELETION OF POWER LINE CELLS TEMPORARY CONSTRUCTION DATA GENERATION → 4 INITIAL PLACEMENT → 5 PLACEMENT IMPROVING → (1)

THE SECOND TABLE 21

| BLOCK NAME | BLOCK TYPE | CELL SIZE X | Y | LOCATION X | Y | OCCUPIED AREA XFROM | XTO |
|---|---|---|---|---|---|---|---|
| A | BT1 | 6 | 2 | 3 | 5 | 3 | 8 |
| B | BT1 | 6 | 2 | 4 | 2 | 4 | 9 |
| C | BT2 | 2 | 1 | 9 | 5 | 9 | 10 | ns
BLOCK PLACEMENT METHOD

This application is a continuation, of application Ser. No. 07/117,995, filed Nov. 9, 1987 now abandoned.

BACKGROUND OF THE INVENTION

The present invention relates to a block placement method for automatically placing a plurality of blocks on a substrate, such as a printed wiring board and a substrate of a large scale integrated (LSI) circuit.

Conventionally, the block placement method uses the placement cells of m rows and n columns (m, n:integer, $m \geq 2$, $n \geq 2$) defined on a substrate for the blocks to be placed. The conventional placement method employing the initial placement and its improvement is described in an article by Gary Robson, entitled "Automatic Placement and Routing of Gate Arrays", VLSI DESIGN, pp.35-43, April issue 1984 (referred as reference A in the following).

According to the reference A, it is assumed that any block of arbitrary size can freely be located on some cells among mxn cells defined on a substrate. However, there are ground and power line areas on the substrate, on which the usual block cannot be placed. In other words, the block of its size larger than the distances between ground or power lines cannot be placed. For example, the block for the so-called hardmacro, which is a kind of circuit designed to place and connect hardware elements, corresponds to this case. Therefore, the locations of the ground and power lines are previously searched and the blocks to be placed are extended so as to bestride those ground and power lines.

Therefore, since the locations of the power and ground lines have already been determined, the placement location of the block should be determined beforehand to provide the extended block on the basis of calculation of the relative positions of the power and ground lines followed by the actual provision of the extended block in consideration of the disposed power and ground lines.

Consequently, the various extended blocks must be provided, since the locations of the power and ground lines are different for each block. Moreover, the location of the extended blocks can hardly be moved in the placement improving step, because the locations of the power and ground lines within the block are fixed.

SUMMARY OF THE INVENTION

One object of the present invention is, therefore to provide a block placement method free from the above-mentioned drawbacks.

According to this invention, there is provided a block placement which includes, a temporary groundwork design step for designing a temporary groundwork in which no block placement inhibited area is contained;

a provisional groundwork design step for initially placing blocks on the temporary groundwork designed by said temporary groundwork design step;

a placed substrate design step for inserting the block placement inhibited area into a provisional groundwork designed by the provisional groundwork design step so as to obtain an extended block; and a routing design step for routing the wiring within, the extended block on a placed substrate designed by the placed substrate design step.

BRIEF DESCRIPTION OF THE DRAWINGS

The features and advantages of the present invention will become more clearly appricated from the following detailed description when taken in conjuction with the accompanying drawings in which:

FIGS. 1A to 1E and FIGS. 2A to 2C show a preferred embodiment of the present invention. In the entire drawings, the same reference numerals denote the same structural elements, respectively.

DETAILED DESCRIPTION OF THE PREFERRED EMBODIMENT

Figure 2B:
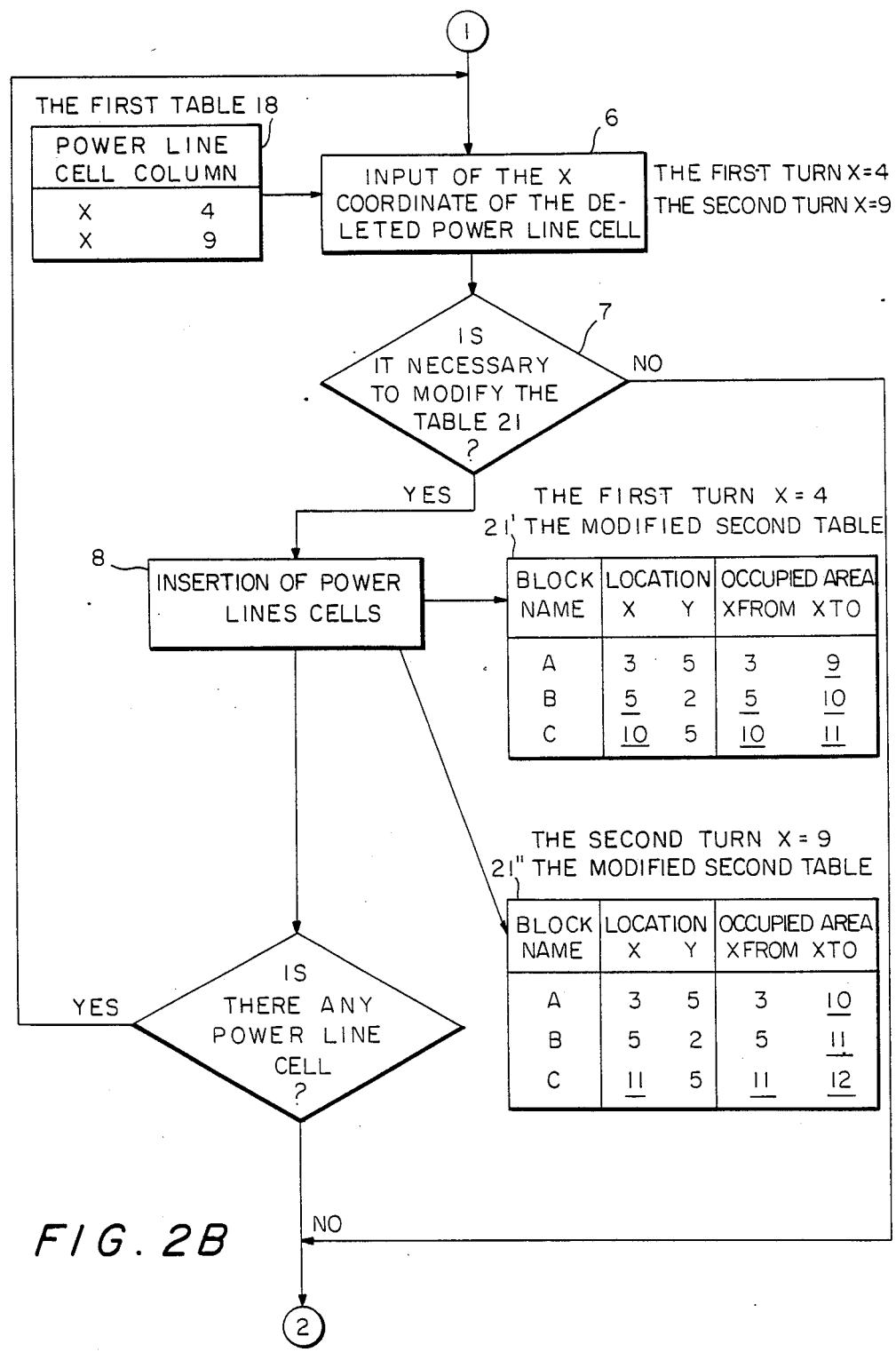

An embodiment of the present invention will now be described in detail with reference to the accompanying drawings.

Referring to FIGS. 1A to 1E, a preferred embodiment of the present invention comprises: the first step for designing a temporary groundwork 33 shown in FIG. 1B by excluding from a substrate 32 the areas, such as power lines 31, where the block cannot be placed. The second step for designing a provisional groundwork 37 by initially placing a block 34 of block type BT1 as blocks A and B, and a block 35 of block type BT2 as block C on the temporary groundwork 33, and then by optimizing those placements of the blocks, so as to obtain the result of the placement shown in FIG. 1C. The third step for designing a placed substrate 39 by inserting the power lines 31 into their original locations on the groundwork 37 and by extending the blocks A and B in FIG. 1C to obtain the extended blocks 38 shown in FIG. 1D. The fourth step for routing the wiring 40 within the blocks 38 as shown in FIG. 1E.

Now, referring to FIGS. 1A to 1E and FIGS. 2A to 2B, the block placement method according to the embodiment of the invention will be described, assuming that the processing is executed resorting to a computer program.

Referring to FIGS. 1A and 2A, the size $X=12$ and $Y=7$ of the substrate 32 and the information about the column location of the power line are read out from an original substrate construction file 17 (procedure 1 in FIG. 2A). Next, the column locations $X=4$ and 9 of the power lines 31 on the substrate 32 are stored into the first table 18 (procedure 2 in FIG. 2A). Then, the cells corresponding to the locations of the power lines are excluded from the substrate 32 so as to provide a groundwork called as a temporary groundwork 33. Simultaneously, the location values of the excluded lines 31 on the substrate 32 are stored into a groundwork construction file 19. Also, since the size of the groundwork 33 changes to $X=10$ from $X=12$ because of exclusion of two columns, the groundwork size of the groundwork 33 to be stored into the file 19 is $X=10$, $Y=7$. Since the locations of the excluded power lines 31 are the fourth and ninth columns on the substrate 32, they corresponds to the rights of the third and seventh columns on the groundwork 33. That is, the values "right to $X=3$" and "right to $X=7$" are stored into the file 19 as the locations of the excluded columns (procedure 3 in FIG. 2A).

The above description corresponds to the first step of the embodiment of the invention. Now, the second step of it will be explained.

Referring to FIGS. 1C and 2A, the type informations of the blocks A, B and C on the groundwork 37 read from a logical connection file 20 are the block types BT1, BT1 and BT2, respectively. The sizes of the block types BT1 and BT2 obtained from the groundwork construction file 19 are X=6, Y=2 and X=2, Y=1, respectively. By using that information, the initial block placement (procedure 4 in FIG. 2A) is performed. Next, the placement improving (procedure 5 in FIG. 2A) is performed, the detail of which is given in the reference A. In the example shown in FIG. 1C, the locations of the blocks A, B and C are represented by their left downward corner coordinates (3,5), (4,2) and (9,5), respectively. The areas occupied by those blocks are represented by their left and right end X coordinate pair (Xfrom, Xto) as (3,8), (4,9) and (9,10), respectively. All those informations are stored into the second table 21 shown in FIG. 2A. Thus the second step of the embodiment of the invention terminates.

Now, the third step of the embodiment of the invention will be described. Referring to FIGS. 1C, 1D and 2B, the coordinate value X=4 of the power line is firstly read from the first table 18 (procedure 6 in FIG. 2B). Using this value, it will be checked whether the block location collides against that of the power line or not. In other words, it will be checked whether the block placement indicated in the second table 21 should be changed or not (procedure 7 in FIG. 2B). In the second table 21, the left downward corner coordinates of the disposed blocks 36 on the groundwork 37 in FIG. 1C are stored. Among those values, the X coordinate larger than 4, that is, those for blocks B and C, should be incremented by one because of the deletion of the power lines in the procedure 3 in FIG. 2A. Also, the values in the second table 21 for representing the areas occupied by the blocks, for example, X=3 and 8 for the block A in FIG. 1C, have to be checked in response to the re-insertion of the power line at X=4. Namely, the right end value X=8 for block A should be changed to 9. Therefore, the result of the decision procedure 7 in FIG. 2B is "Yes" in this case, with the result that the processing proceeds to the procedure 8. In the procedure 8, the modification of the values in the table 21 is performed in a way mentioned above due to the effect of the re-insertion of the power line. Referring to the modified second table 21' in FIG. 2B, the X coordinates of the blocks B and C are incremented to 5 and 10, respectively. Also, the occupied area entries in the modified second table 21' are changed to (3,9) for block A, (5,10) for B and (10,11) for C, respectively. Thereafter, it is checked whether the data about any power line column still exists or not in the table 18 (procedure 9 in FIG. 2B). At this time, the coordinate X=9 still remains. Therefore, the procedure 9 gets "Yes", with the result that it returns to the procedure 6. At the procedure 6, the coordinate X=9 is read out to decide whether the content of the table 21' should be changed further or not.

As is obvious from the disposed blocks 36 in FIG. 1C, the "Xto" coordinates for the blocks A and B have to be changed in response to the re-insertion of the power line at X=9. Also, the location coordinate, "Xfrom" and "Xto" for the block C have to be changed. Therefore, the decision procedure 7 gives the result "Yes", so as to proceed to the procedure 8. Thus, the table 21' modified due to the re-insertion of the power line at X=4 is further modified to the table 21" owing to the power line at X=9. In the table 21", the block location coordinate for block C is changed to 11. The occupied areas entries becomes (3,10), (5,11) and (11,12) for the blocks A, B and C, respectively. Again, the decision procedure 9 is performed to check whether any coordinate of power line still exists in table 18 or not. Since there is no more power line coordinate, the procedure 9 gets "No", with the result that it proceeds to a procedure 10. The following description corresponds to the fourth step of the embodiment of the present invention, in which the selection of the connection pattern to be placed on the power line cells is performed. In this step, the following processing is repeated for all the disposed blocks obtained by the previous procedures 1 to 9.

Firstly, the data relating to the block A is read out from the modified table 21" in the procedure 10. In a procedure 11, it is checked whether the power line cells exist in the occupied area for the block A or not. Since the occupied area for the block A is from X=3 to 10, and the X coordinates of the power lines are X=4 and 9, as is obvious from the table 18, the existence of the power line in the occupied area is found. Then, in a procedure 12 the relative position of the power line 31 to the block A is calculated. In other words, the distance of power line from the left end of the block A is calculated from the following equation:

distance = (X coordinate of the power line cells)
(Xfrom of the occupied area) - (the number of power lines inserted into the block).

Figure 2C:
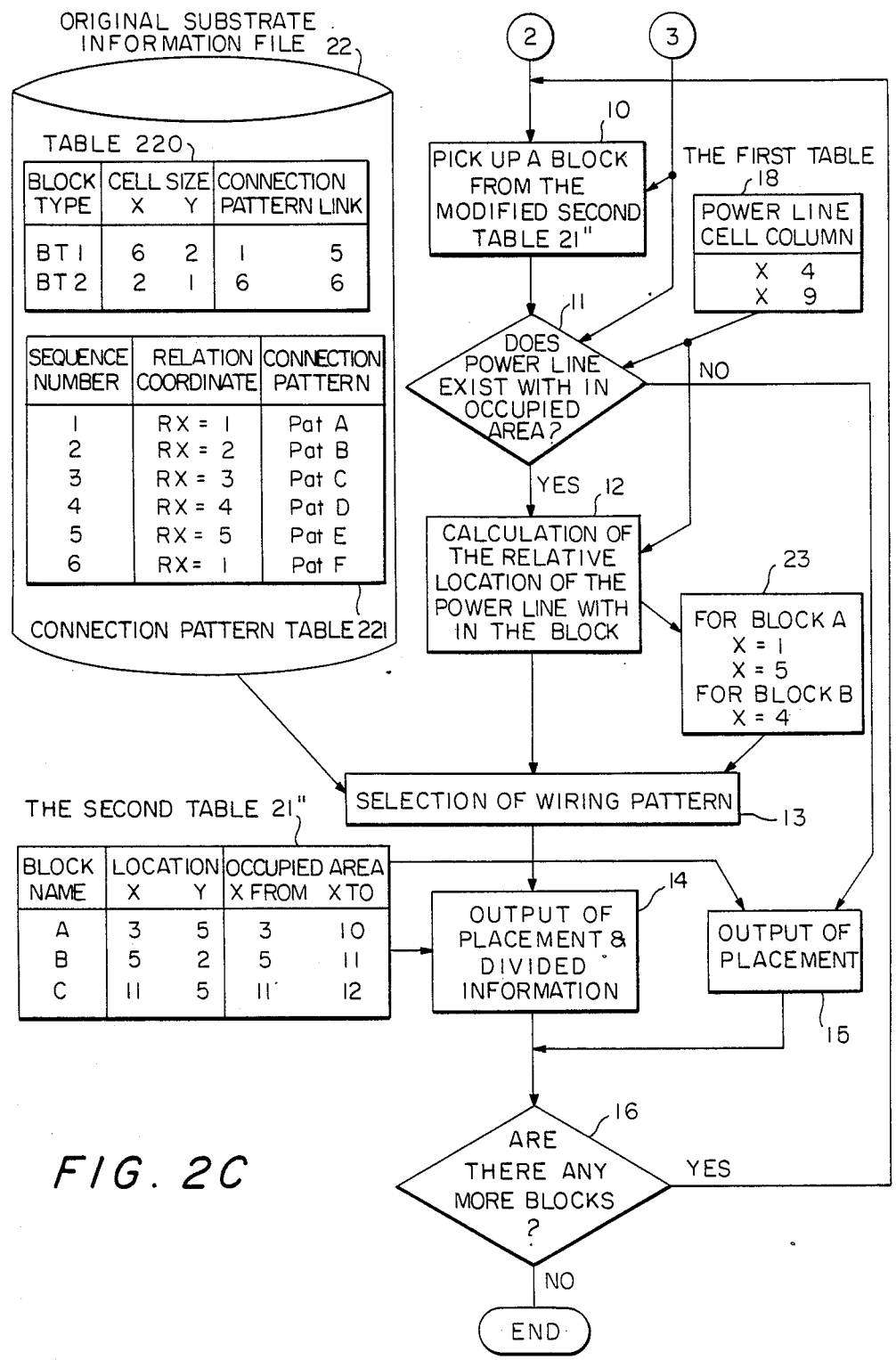

Therefore, since the distance for the power line at X=4 with respect to the block A is calculated as 4−3=1, the power line cell is located between the first and second cell columns from the left end of the block A. Also, the distance for the power line at X=9 is calculated as 9−3−1=5, so that it is located between the fifth and sixth cell columns from the left end of the block A. This result is stored into a work area 23 as the relative coordinates RX=1 and 5 for the block A. The data RX=1 and 5 means that the power line cell columns exist to the right of the RX=1 and 5. According to FIG. 2C, it is shown in an original groundwork information file 22 which wiring pattern has to be used for the selected block type, when the power line cell column exists within the disposed block. The pattern varies against the relative position of the power line cells from the left end of the block. According to the embodiment, the block type BT1 uses the sequential number 1 to 5 given in a connection pattern table 221, as is indicated in an entry of the connection pattern link in a table 220. Referring to the connection pattern table 221, a connection pattern "pat A" should be used for the block, if the relative coordinate RX=1, while "pat B" for RX=2. For the block type BT2, only the sequence number 6 is used. Therefore, a connection pattern "pat F" should be used for the block if RX=1. In a procedure 13, the connection pattern is selected as output. As is obvious from the logical connection file 20 and the work area 23, the block type of the block A is BT1 and the relative coordinate of the power line at X=4 with respect to the block A is RX=1. Thus, the "pat A" is selected from the connection pattern table 221. In a procedure 14, the block placement X=3 and Y=5 given in table 21 is written out together with the wiring information within the block. It is divided into the information about the subblocks defined by power lines existed within the block. Namely, since the relative positions of power line cell columns are to the right of RX=1 and 5, the wiring within block A of the block type BT1 is separated at the right sides of RX=1 and 5 into three portions.

In a procedure 16, it is checked whether there is any unprocessed block or not. If the result is "Yes", the procedures 10 to 16 are repeated. Otherwise, all the processing terminates.

According to the present embodiment, since there are still processing for the blocks B and C, the processing explained above will be repeated. In the procedure 10, the data relating to the block B is read out from the second table 21''. In the procedure 11, the power line cell column at X=9 is found to be within the occupied area of the block B, that is, (5,11) by referring to the first table 18. In the procedure 12, the relative distance of the power line cell column is calculated as 9−5=4. In the procedure 13, the connection pattern "pat D" is chosen because of the relative cooordinate RX=4. In the procedure 14, the block placement X=5 and Y=2 is written out together with the wiring information within the block B, which is divided into two portions separated at RX=4.

Next, the processing for the block C will be performed. In the procedure 10, the information about the block C is read out from the second table 21''. Subsequently, it is checked whether the power line 31 exists within the occupied area of the block C or not. The result is "No". Therefore, in a procedure 15 the block placement X=11, Y=5 given in the second table 21'' is written out together with undivided block wiring information of the block C of block type BT2. Then, the result of the procedure 16 indicates that there is no more unprocessed blocks, so that the block placement process terminates.

In the above explanation, the power line 31 is assumed to exist vertically in the substrate 32 in FIG. 1A. However, the present invention can be applied to the case where it exists in the horizontal or both horizontal and vertical directions.

Moreover, the present invention can be applied to the substrate which, in addition to the power lines, contains the ground lines and the placement inhibited blocks. The substrate designed according to the present invention can be made by way of the general manufacturing technique for the printed wiring board, ceramic wiring board and the integrated circuit. The manufacturing method of the kind is described in the chapter 2, pp.38–45 of a book by C. Mead and L. Conway entitled "Introduction to VLSI Systems", Addison-Wesley, 1980.

As is minutely described above, according to the block placement method of the present invention, the block placement inhibited area, such as power line and ground line, is initially excluded from the substrate and then the blocks are placed. Thereafter, the block placement inhibited area is inserted so that the placed blocks are separated bestridly by the inhibited area. Therefore, only one type of block is enough to design the placement, with the result that the steps of the design and fabrication decrease and that the management of the design process becomes simple.

What is claimed is:

1. A block placement method for automatically placing a plurality of blocks on a substrate, wherein the method includes the steps of:
    a temporary groundwork design step for designing a temporary groundwork design which does not contain a block placement inhibited area but has an identifiable location for said area;
    a provisional groundwork design step for initially placing said blocks upon said temporary groundwork design designed by said temporary groundwork design step and subsequently improving the initial block placement, at least one block being placed over said identifiable location;
    a placed substrate design step for inserting, at said identifiable location, said block placement inhibited area into the provisional groundwork design designed by said provisional groundwork design step so as to obtain an extended block having separated portions; and
    a routing design step for routing wiring within said extended block, between said separated portions, on a substrate designed by said placed substrate design step.

2. A block placement system for automatically placing a plurality of blocks on a substrate, wherein the system includes:
    temporary groundwork design means for designing a temporary groundwork design which does not contain a block placement inhibited area but has an identifiable location for said area;
    provisional groundwork design means for initially placing said blocks upon said temporary groundwork design designed by said temporary groundwork design means and subsequently improving the initial block placement, at least one block being placed over said identifiable location;
    placed substrate design means for inserting, at said identifiable location, said block placement inhibited area into the provisional groundwork design designed by said provisional groundwork design means so as to obtain an extended block having separated portions; and
    routing design means for routing wiring within said extended block, between said separated portions, on a placed substrate designed by said placed substrate designed means.

* * * * *